(12) United States Patent
Dhanasekaran

(10) Patent No.: US 8,576,011 B2
(45) Date of Patent: Nov. 5, 2013

(54) AMPLIFIER WITH HIGH POWER SUPPLY NOISE REJECTION

(75) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/235,285

(22) Filed: Sep. 16, 2011

(65) Prior Publication Data

US 2013/0002359 A1    Jan. 3, 2013

Related U.S. Application Data

(60) Provisional application No. 61/502,752, filed on Jun. 29, 2011.

(51) Int. Cl.
*H03F 3/21* (2006.01)

(52) U.S. Cl.
USPC .............................. 330/297; 330/127; 330/279

(58) Field of Classification Search
USPC ............ 330/310, 133, 98, 150, 296–298, 285
See application file for complete search history.

(56) References Cited

U.S. PATENT DOCUMENTS

| | | | |
|---|---|---|---|
| 3,988,691 A | 10/1976 | Shih | |
| 5,103,188 A | 4/1992 | Bender | |
| 5,792,956 A | 8/1998 | Li | |
| 7,193,459 B1 * | 3/2007 | Epperson et al. | 330/130 |
| 7,605,651 B2 * | 10/2009 | Ripley et al. | 330/133 |
| 2010/0150357 A1 | 6/2010 | Chang et al. | |

FOREIGN PATENT DOCUMENTS

| | | |
|---|---|---|
| EP | 1355414 A1 | 10/2003 |
| WO | 0213372 A2 | 2/2002 |

OTHER PUBLICATIONS

International Search Report and Written Opinion—PCT/US2012/045130—ISA/EPO—Dec. 10, 2012.

* cited by examiner

*Primary Examiner* — Hieu Nguyen
(74) *Attorney, Agent, or Firm* — Ramin Mobarhan

(57) ABSTRACT

An amplifier with high power supply rejection is disclosed. In an exemplary implementation, an amplifier includes a first stage configured to receive a signal to be amplified, a second stage comprising an input transistor coupled to the first stage, and further comprising at least one additional transistor, and a voltage regulator configured to received a first supply voltage and generate a regulated supply voltage, the first supply voltage coupled to the at least one additional transistor, the regulated supply voltage coupled to the first stage and the input transistor of the second stage to improve power supply noise rejection of the apparatus.

15 Claims, 4 Drawing Sheets

AMPLIFIER WITH HIGH POWER SUPPLY NOISE REJECTION

CLAIM TO PRIORITY

This patent application claims the benefit of priority from U.S. Provisional Patent Application No. 61/502,752, entitled "Amplifier with High Power Supply Rejection Ratio (PSRR)" filed on Jun. 29, 2011 and assigned to the assignee hereof and hereby expressly incorporated by reference herein.

BACKGROUND

1. Field

The present application relates generally to the operation and design of amplifiers, and more particularly, to improving power supply noise rejection of an amplifier.

2. Background

Class-G/H power amplifiers produce large supply variation for an opamp that is driving a load. This results in total harmonic distortion (THD) degradation unless the opamp features a large power supply rejection ratio (PSRR). Unfortunately, conventional amplifiers may not have a large enough PSRR.

Therefore it is desirable to have an amplifier with improved power supply noise rejection.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
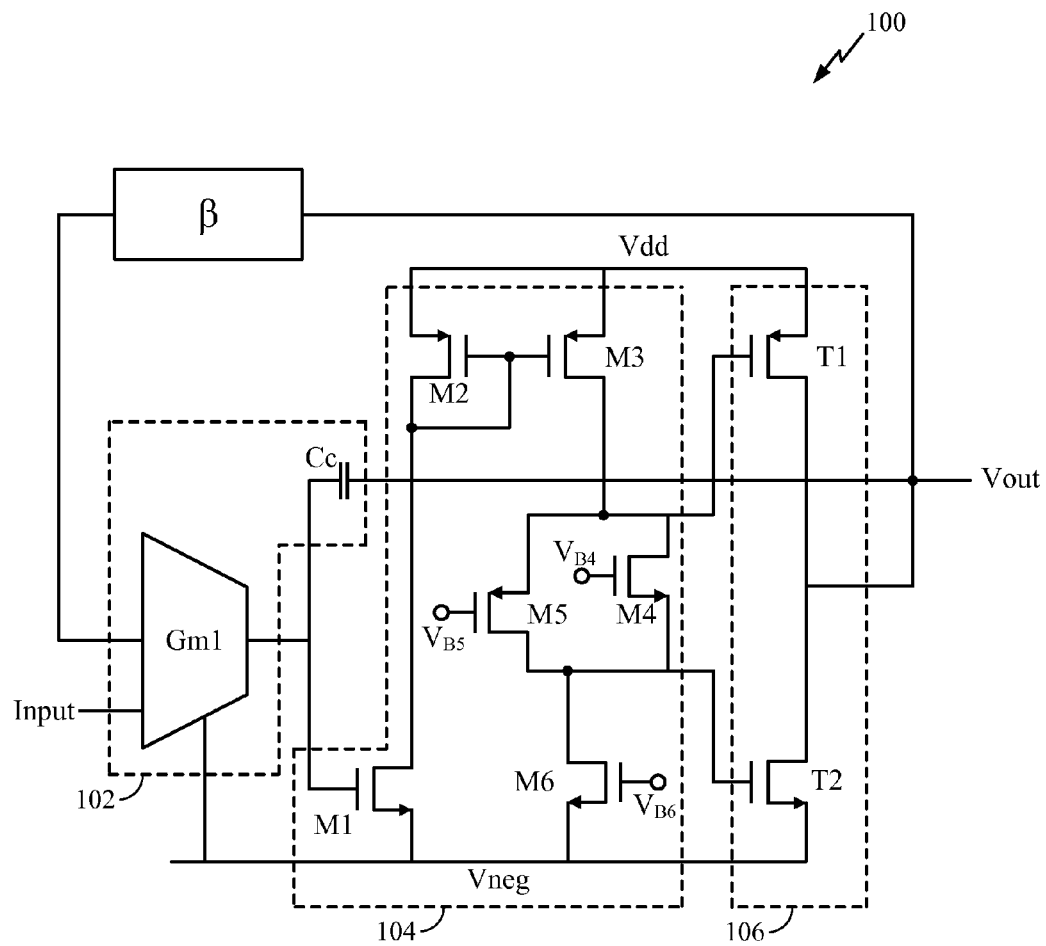
FIG. 1 shows a conventional amplifier that illustrates how power supply noise couples into the output of the amplifier.

FIG. 1 shows a conventional amplifier 100 that illustrates how power supply noise couples into the output of the amplifier. The amplifier 100 comprises a first stage 102 coupled to a second stage 104 that is coupled to an output stage 106, which produces an amplifier output signal (Vout). The first stage 102 receives an input signal for amplification and comprises gain block Gm1 and capacitor Cc. The second stage 104 comprises transistors M1-M6, and the output stage 106 comprises transistors T1-T2. The block β is a feedback factor that is considered to be outside of the identified amplifier stages. The transistors M4, M5, and M6 receive bias signals $V_{B4}$, $V_{B5}$, and $V_{B6}$, respectively, at their gate terminals.

A negative voltage supply (Vneg) is coupled to all stages. Unfortunately, the PSRR of the Vneg supply is limited by the bandwidth of the amplifier 100. For example, under certain conditions, the gate of transistor M1 is forced to the Vneg supply level. Thus, the coupling of Vneg to Vout is approximately equal to the reciprocal of the $1^{st}$ stage gain according to equation (1) as follows.

$$\frac{Vout(s)}{Vneg(s)} \sim = \frac{sCc}{\beta * Gm1} \quad (1)$$

Figure 2:
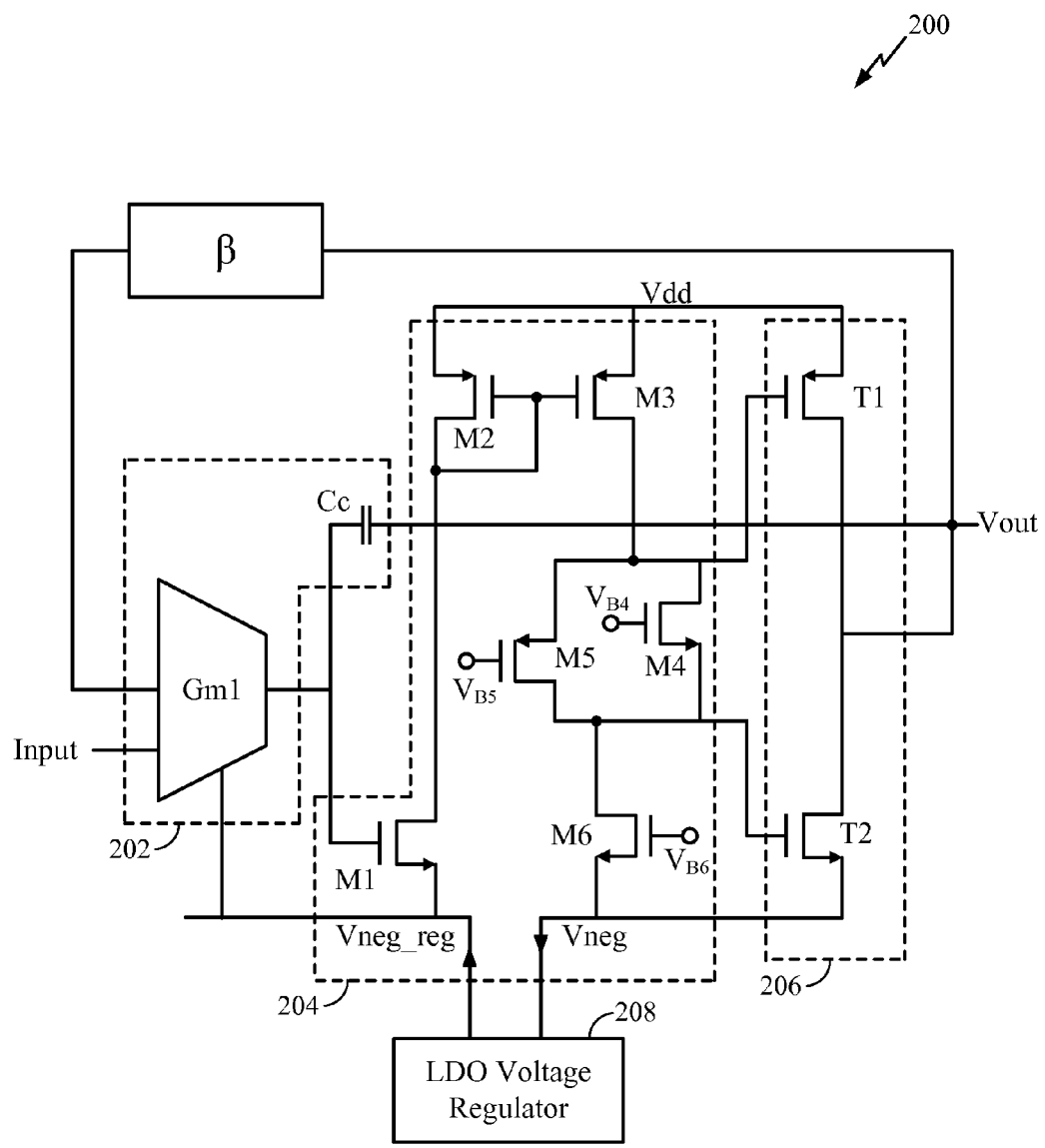
FIG. 2 shows an exemplary amplifier with improved power supply noise rejection.

FIG. 2 shows an exemplary amplifier 200 with improved power supply noise rejection. The amplifier 200 comprises a first stage 202 coupled to a second stage 204 that is coupled to an output stage 206, which produces an amplifier output signal (Vout). The first stage 202 receives an input signal for amplification and comprises gain block Gm1 and capacitor Cc. The second stage 204 comprises transistors M1-M6, and the output stage 206 comprises transistors T1-T2. The block β is a feedback factor that is considered to be outside of the identified amplifier stages. The transistors M4, M5, and M6 receive bias signals $V_{B4}$, $V_{B5}$, and $V_{B6}$, respectively, at their gate terminals.

The amplifier 200 also comprises a low dropout (LDO) voltage regulator 208 that receives the Vneg supply voltage and generates a regulated supply voltage (Vneg_reg) that is coupled to the first stage and a source terminal of the input transistor M1 of the second stage 204 of the amplifier 200. For example, in one implementation, the Vneg_reg supply is regulated at −0.6 volts and is coupled to Gm1 and the source terminal of transistor M1 of second stage 204. The Vneg supply is coupled to at least one additional transistor (i.e., M6) in the second stage 204 and is further coupled to the output stage 206.

With the LDO regulator 208 to regulate the negative supply voltage connected to Gm1 and the source terminal of transistor M1, the gate terminal of transistor M1 no longer tracks the Vneg supply as in the conventional amplifier 100, but instead is coupled to the Vneg_reg supply. Thus, in the amplifier 200 the coupling of the Vneg supply to Vout now includes the rejection ratio (LDO_PSR) of the LDO voltage regulator 206. For example, the PSRR is improved by a factor of (1/LDO_PSR), which results in an overall PSRR improvement for the amplifier 200 according to equation (2) as follows.

$$\frac{Vout(s)}{Vneg(s)} \sim = \frac{sCc}{\beta * Gm1 * \text{LDO\_PSR}} \quad (2)$$

Figure 3:
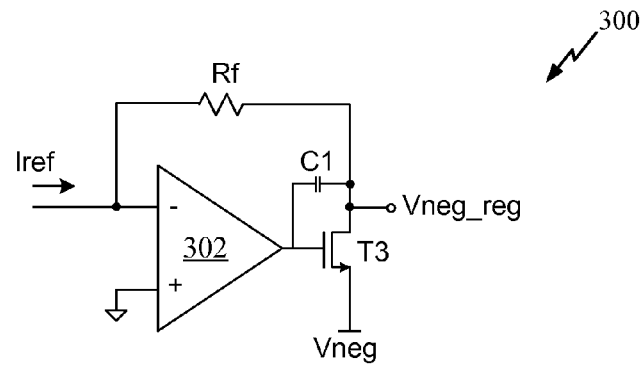
FIG. 3 shows an exemplary low dropout voltage regulator for use in various exemplary embodiments.

FIG. 3 shows an exemplary low dropout voltage regulator 300 for use in various exemplary embodiments. For example, the regulator 300 is suitable for use as the LDO voltage regulator 206 shown in FIG. 2. The regulator 300 comprises an amplifier 302 that receives a reference current (Iref) at its inverting input and has its non-inverting input tied to a power supply ground. An output of the amplifier 302 is connected to a gate terminal of transistor T3. A source terminal of the transistor T3 is coupled to the negative voltage supply (Vneg). A drain terminal of the transistor T3 provides the regulated negative supply voltage (Vneg_reg). A capacitor C1 is connected between the drain and gate terminals of the transistor T3. A feedback resistor (Rf) is connected between the source terminal of the transistor T3 and the inverting input of the amplifier 302. The feedback resistor Rf is used to set the value of Vneg_reg=(Iref*Rf) and the capacitor C1 is used for compensation. It should be noted that the regulator 300 is just one implementation and that other voltage regulator implementations may be used.

Figure 4:
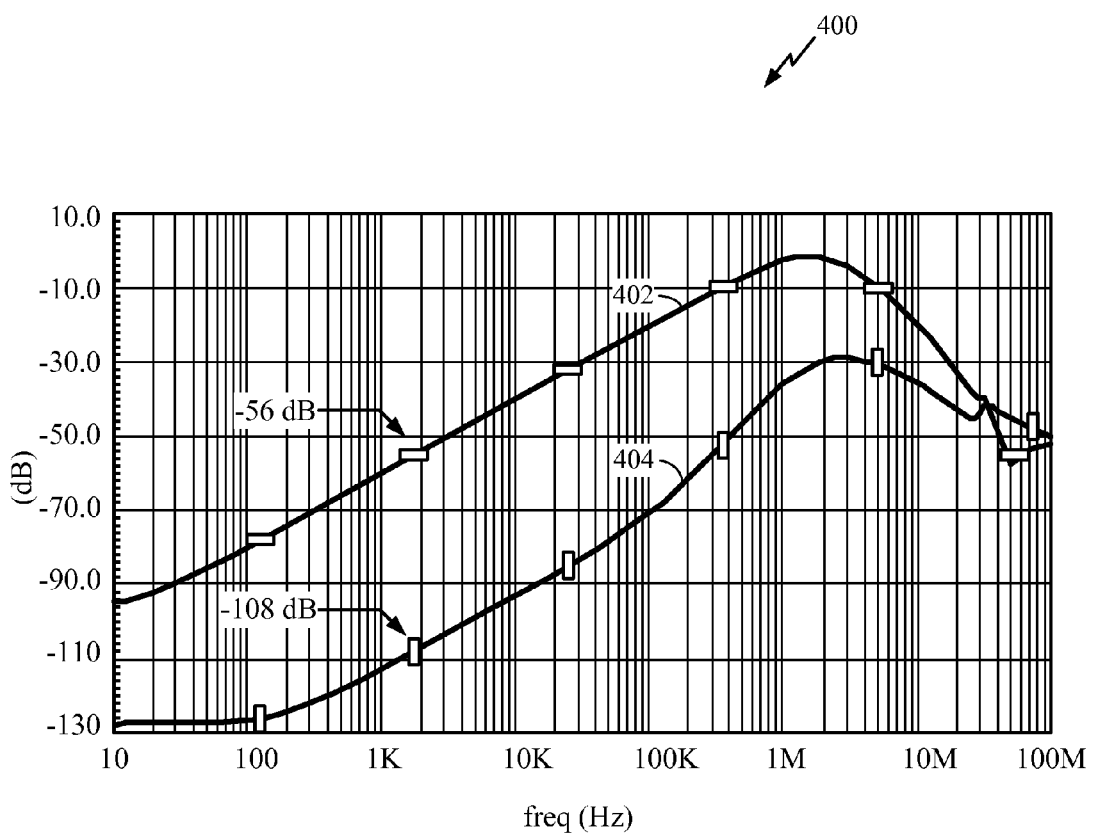
FIG. 4 shows an exemplary graph illustrating the improvement in power supply noise rejection provided by the exemplary embodiments.

FIG. 4 shows an exemplary graph 400 illustrating the improvement in amplifier PSRR provided by the exemplary embodiments. The graph 400 shows a plot line 402 representing the Vneg PSRR for the conventional amplifier 100, and a plot line 404 representing the Vneg PSRR for the exemplary amplifier 200. As can be seen from the graph 400, at 2 KHz, the Vneg PSRR is improved from −56 dB to −108 dB by the exemplary amplifier 200.

Figure 5:
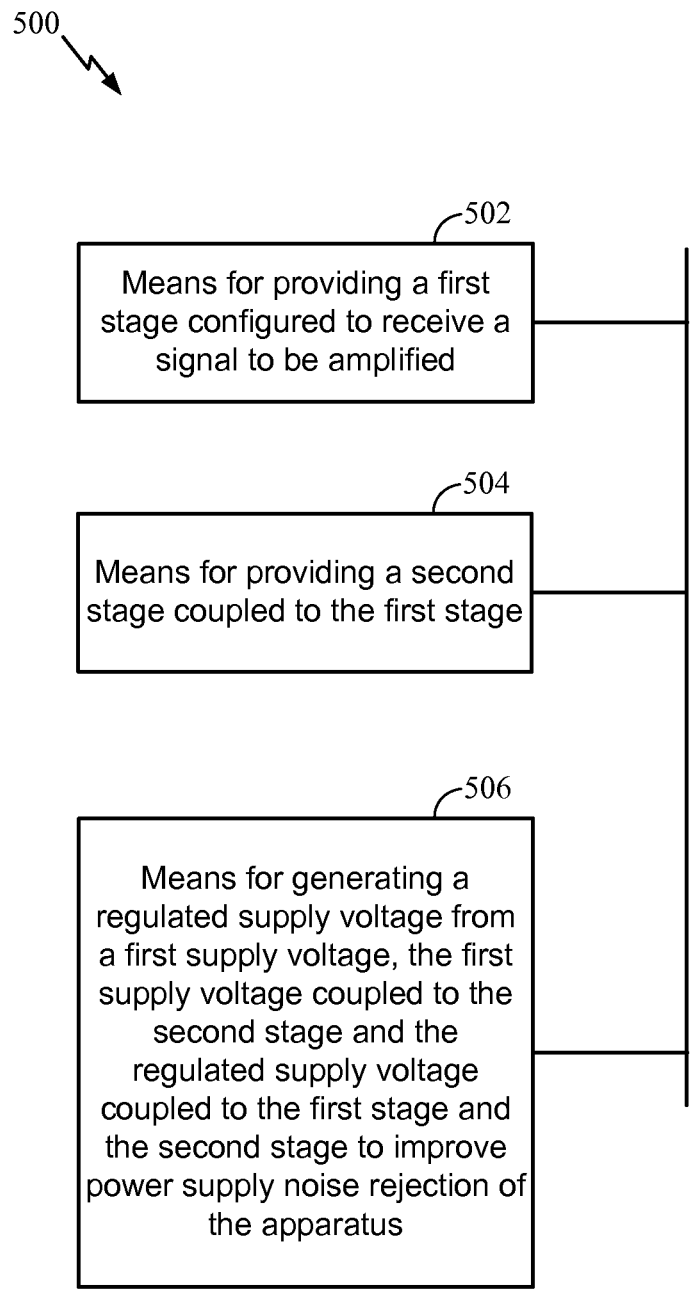
FIG. 5 shows an exemplary amplifier apparatus configured for improved power supply noise rejection.

FIG. 5 shows an exemplary amplifier apparatus 500 configured for improved power supply rejection. The apparatus 500 is suitable for use as the amplifier 200 shown in FIG. 2. In an aspect, the apparatus 500 is implemented by one or more modules configured to provide the functions as described herein. For example, in an aspect, each module comprises hardware and/or hardware executing software.

The apparatus 500 comprises a first module comprising means (502) for providing a first stage configured to receive a signal to be amplified, which in an aspect comprise the first stage 202 shown in FIG. 2.

The apparatus 500 comprises a second module comprising means (504) for providing a second stage coupled to the first stage, which in an aspect comprise the second stage 204 shown in FIG. 2.

The apparatus 500 comprises a third module comprising means (506) for generating a regulated supply voltage from a first supply voltage, the first supply voltage coupled to the second stage and the regulated supply voltage coupled to the first stage and the second stage to improve power supply noise rejection of the apparatus, which in an aspect comprises the voltage regulator 208 shown in FIG. 2.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    a first stage configured to receive a signal to be amplified and to generate an amplified version of the signal at an output terminal;
    a second stage comprising an input transistor connected to the first stage, and further comprising at least one additional transistor; and
    a voltage regulator configured to receive a negative supply voltage and generate a negative regulated supply voltage, the negative supply voltage connected to the at least one additional transistor, the negative regulated supply voltage connected to the first stage and the input transistor of the second stage, the voltage regulator configured to reduce coupling of the negative supply to the output terminal to improve power supply noise rejection of the apparatus.

2. The apparatus of claim 1, further comprising an output stage connected to the negative supply voltage.

3. The apparatus of claim 1, the negative regulated supply voltage connected to a source terminal of the input transistor of the second stage.

4. The apparatus of claim 1, the first stage comprising a gain block connected to a capacitor.

5. The apparatus of claim 1, the voltage regulator comprising a low dropout voltage regulator.

6. The apparatus of claim 5, the low dropout voltage regulator comprising:
    an amplifier configured to receive a reference current at an input terminal and generate an amplifier output;
    a transistor configured to receive the amplifier output at a gate terminal, the transistor connected to the negative supply voltage at a source terminal and connected to the negative regulated supply voltage at a drain terminal; and
    a resistor connected between the drain terminal and the input terminal.

7. The apparatus of claim 1, the voltage regulator providing a power supply noise rejection characteristic (LDO_PSR) that improves the power supply noise rejection of the apparatus.

8. The apparatus of claim 7, the power supply noise rejection of the apparatus is improved by a factor of (1/LDO_PSR).

9. An apparatus comprising:
    means for providing a first stage configured to receive a signal to be amplified and to generate an amplified version of the signal at an output terminal;
    means for providing a second stage connected to the first stage; and
    means for generating a negative regulated supply voltage from a negative supply voltage, the negative supply voltage connected to the second stage and the negative regulated supply voltage connected to the first stage and a means for switching of the second stage, the means for generating configured to reduce coupling of the negative supply to the output terminal to improve power supply noise rejection of the apparatus.

10. The apparatus of claim 9, further comprising means for providing an output stage connected to the first supply voltage.

11. The apparatus of claim 9, the means for generating comprising a means for regulating.

12. The apparatus of claim 11, the means for regulating comprising:
    an amplifier configured to receive a reference current at an input terminal and generate an amplifier output;
    a transistor configured to receive the amplifier output at a gate terminal, the transistor connected to the negative supply voltage at a source terminal and connected to the negative regulated supply voltage at a drain terminal; and
    a resistor connected between the drain terminal and the input terminal.

13. The apparatus of claim 9, the means for generating provides a power supply noise rejection characteristic that improves the power supply noise rejection of the apparatus.

14. The apparatus of claim 13, the power supply noise rejection of the apparatus is improved by a factor equivalent to a reciprocal of the power supply noise rejection characteristic of the means for generating.

15. The apparatus of claim 9, the means for switching comprising an input transistor of the second stage and the negative regulated supply voltage connected to a source terminal of the input transistor of the second stage.

* * * * *